United States Patent [19]
van Roermund

[11] Patent Number: 4,860,354
[45] Date of Patent: Aug. 22, 1989

[54] ARRANGEMENT FOR DECODING A STEREO MULTIPLEX SIGNAL

[75] Inventor: Arthur H. M. van Roermund, Eindohoven, Netherlands

[73] Assignee: U. S. Philips Corporation, New York, N.Y.

[21] Appl. No.: 126,381

[22] Filed: Nov. 30, 1987

[30] Foreign Application Priority Data

Dec. 22, 1986 [NL] Netherlands .................. 8603249

[51] Int. Cl.$^4$ .............................................. H04H 5/00
[52] U.S. Cl. ........................................ 381/7; 381/10; 381/11; 331/25
[58] Field of Search .............. 337/25; 381/4, 7, 13, 381/2, 3, 10, 11; 455/266, 339, 340

[56] References Cited

U.S. PATENT DOCUMENTS

| | | | |
|---|---|---|---|
| 4,419,541 | 12/1983 | Kishi et al. ........................ | 381/7 |
| 4,569,072 | 2/1986 | van Roermund .................... | 381/7 |
| 4,626,796 | 12/1986 | Elder ................................... | 337/25 |

*Primary Examiner*—Forester W. Isen
*Attorney, Agent, or Firm*—Edward W. Goodman

[57] ABSTRACT

Arrangement for decoding a stereo multiplex signal, having a baseband stero signal (L+R), a stereo difference signal (L−R) which is amplitude-modulated on a suppressed sub-carrier, and a pilot signal having a frequency located between the frequency bands of the two signals, the arrangement having an input for the stereo multiplex signal and left and right stereo signal outputs, the input being coupled both, via a pilot selection circuit, to a phase-locked loop for regenerating the sub-carrier and to a multiplier circuit for multiplying at least the modulated stereo difference signal by the regenerated sub-carrier. In order to improve the stereo channel separation, the pilot selection circuit includes a bandpass filter of the switched capacitor type, a clock input of which is coupled to an output of an voltage-controlled oscillator incorporated in the loop. A mono-stereo control can be realized therein in a simple manner by varying the phase transfer of the switched capacitor bandpass filter at least at the pilot frequency in dependence upon a mono-stereo control signal.

4 Claims, 1 Drawing Sheet

ARRANGEMENT FOR DECODING A STEREO MULTIPLEX SIGNAL

BACKGROUND OF THE INVENTION

1. Field of the Invention

The invention relates to an arrangement for decoding a stereo multiplex signal, comprising a baseband stereo sum signal (L+R), a stereo difference signal (L−R) which is amplitude-modulated on a suppressed subcarrier, and a pilot signal located between the frequency bands of the two signals, said arrangement having an input for the stereo multiplex signal and left and right stereo signal outputs, said input being coupled at one end via a pilot selection circuit to a phase-locked loop for regenerating the sub-carrier and, at the other end, to a multiplier circuit for multiplying at least the modulated stereo difference signal (L−R) by the regenerated subcarrier.

2. Description of the Related Art

An arrangement of this type is known from U.S. Pat. No. 4,249,038.

In the multiplier circuit of the known arrangement, the stereo difference signal (L−R) is synchronously demodulated to the baseband by means of a locally regenerated 38 kHz sub-carrier. In a dematrixing circuit, this baseband stereo difference signal (L−R) is subsequently both added to and subtracted from the baseband stereo sum signal (L+R). Consequently, decoded left and right stereophonic signals L and R are obtained which are available for further signal processing at the left and right stereo signal outputs.

In the known arrangement, the sub-carrier applied to the multiplier circuit is amplitude-controlled in dependence upon a mono-stereo control signal. Consequently, the demodulated baseband stereo difference signal also varies in amplitude resulting in a continuously controlled stereo channel separation. The local 38 kHz sub-carrier is supplied from the controllable oscillator of the loop and for a maximum stereo channel separation, it should be accurately in phase or an anti-phase with the suppressed 38 kHz sub-carrier in the stereo multiplex signal. To this end a 19 kHz oscillator signal is derived from this local sub-carrier by means of frequency division, which oscillator signal is locked in phase via the phase detector and the loop filter with the 19 kHz stereo pilot signal selected in the pilot selection circuit. This phase lock is established in that phase differences deviating from 90° between the two latter signals result in a d.c. phase control signal which controls the phase of the oscillator signal after selection in the loop filter in such a way that the said phase differences are reduced. A selective amplification of the stereo pilot signal is obtained with the pilot selection circuit so that the phase quadrature relation between the stereo pilot signal and the oscillator signal in the phase-locked state of the loop is disturbed to a smaller extent by stereo signal components of the stereo multiplex signal and d.c. offset occurring in the loop.

However, in practice, an unpredictable, constant phase error between the local sub-carrier from which the oscillator signal is derived and the suppressed sub-carrier in the stereo multiplex signal is found to occur. This phase error is mainly caused by the fact that the pilot selection circuit modifies the phase of the stereo pilot signal in a fixed and unpredictable quantity and direction, and moreover, because the phase disturbance due to d.c. offset occurring in the loop is not negligibly small in spite of the selective amplification of the stereo pilot signal. Since the stereo difference signal to be demodulated with the local sub-carrier is not an exact double sideband signal due to the filtering operations (for example in the IF filter) preceding the stereo decoding arrangement, the phase error gives rise to an unwanted crosstalk between the decoded left and right stereo signals, which crosstalk cannot be reduced by means of an amplitude correction. This crosstalk limits the maximum attainable stereo channel separation.

SUMMARY OF THE INVENTION

It is an object of the invention to enhance the maximum attainable stereo channel separation in an arrangement of the type described in the opening paragraph.

To this end such an arrangement according to the invention is characterized in that the pilot selection circuit comprises a bandpass filter of the switched capacitor type, a clock input of which is coupled to an output of a voltage-controlled oscillator incorporated in the loop.

The invention is based on the recognition that a bandpass filter of the switched capacitor type can be tuned very accurately by means of a clock signal derived from a pilot signal at its output to the frequency of this pilot signal at its input.

When using the measure according to the invention, the tuning of the bandpass filter is coupled with the frequency of the pilot signal to be selected so that, on the one hand, phase errors upon the selection of the pilot signal are limited to a minimum and, on the other hand, such a high selective gain of the pilot signal is obtained that parasitic DC offsets with respect to the desired DC phase control signal occurring in the loop are negligibly small. The local subcarrier is therefore accurately in phase or in anti-phase with respect to the suppressed sub-carrier in the stereo multiplex signal, which results in a stereo channel separation which is considerably larger than that of the afore-mentioned known arrangement.

A preferred embodiment of an arrangement according to the invention is characterized in that the phase transfer of the bandpass filter varies at least at the pilot frequency in dependence upon a mono-stereo control signal.

When using this measure, the spatial reproduction is controlled by varying the phase of the locally regenerated sub-carrier with respect to that of the suppressed sub-carrier in the stereo multiplex signal. In order to facilitate an accurate phase adjustment in a phase control range between 0° and 180° (stereo reproduction) and between 90° and 270° (mono reproduction) the tuning of the bandpass filter is coupled in frequency, according to the invention, to the pilot signal to be selected in the bandpass filter, while the phase transfer of this bandpass filter can be controlled by means of a mono-stereo control signal in a manner which can easily be realized by those skilled in the art (for example by capacitance variation). In the case of a suitable choice of the phase control range, the phase transfer of the bandpass filter is adjusted while thee regenerated local sub-carrier in the stereo multiplex signal is obtained in a mutually accurate equal phase or an anti-phase. Phase errors in the loop may be further compensated for, possibly by means of a pre-correction of the phase in the bandpass filter.

A further preferred embodiment of an arrangement according to the invention is characterized in that a signal path of the bandpass filter, in one of the two switching phases, incorporates a controllable amplifier which is coupled to at least one of the switched capacitors for applying a controllable signal voltage thereto, the voltage gain of the controllable amplifier varying in dependence upon the mono-stereo control signal.

When using this measure, it will be possible to control the phase transfer of the bandpass filter in a simple manner.

Such an embodiment is preferably characterized in that the last-mentioned controllable amplifier in the switching phase mainly amplifies the input signal of the bandpass filter in a controllable manner.

When using this measure, a control of the voltage gain of the controllable amplifier mainly produces a zero offset in the transfer characteristic of the bandpass filter and the phase control of the bandpass filter is prevented from adversely affecting the amplitude transfer factor.

BRIEF DESCRIPTION OF THE DRAWINGS

The invention will now be described in greater detail by way of example with reference to the accompanying drawing, in which.

DESCRIPTION OF THE PREFERRED EMBODIMENT

Figure 1:
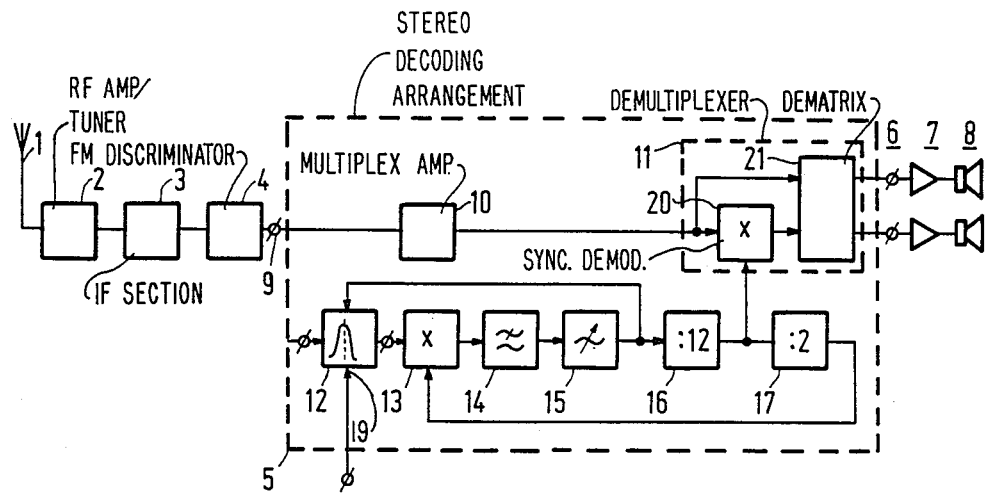
FIG. 1 shows an FM stereo multiplex receiver including a stereo decoding arrangement according to the invention.

FIG. 1 shows an FM stereo multiplex receiver having an RF input to which an RF-FM reception signal is applied from an antenna 1 and which has successively coupled to its RF input: an RF input amplifier and tuning section 2 amplifying the RF-FM reception signal and converting it into an IF-FM signal, an IF section 3 selectively amplifying and limiting the IF-FM signal, an FM discriminator 4 detecting the FM modulation signal of the IF-FM signal—in the given case a stereo multiplex signal—, a stereo decoding arrangement 5 decoding the FM stereo multiplex signal in left and right stereo signals L and R which are applied via audio outputs 6 to audio amplifiers 7 in which they are amplified and subsequently reproduced by means of loudspeakers 8. The stereo multiplex signal to be applied to a multiplex input 9 of the stereo decoding arrangement 5 comprises sum and difference signals (L+R) and (L−R) of left and right stereophonic signals L and R, respectively, the sum signal (L+R) being located in a frequency range from 0 to 15 kHz, the difference signal (L−R) being double sideband AM-modulated on a suppressed sub-carrier of 38 kHz and covering a frequency range of 23 to 53 kHz. The stereo multiplex signal also comprises a 19 kHz stereo pilot signal which serves as a reference frequency during the regeneration of a local 38 kHz mixing carrier.

The stereo decoding arrangement 5 comprises a multiplex amplifier 10 which selectively amplifies the stereo multiplex signal of the multiplex input 9 and which applies this signal to a demultiplexer 11. The demultiplexer 11 comprises a synchronous detector 20 and a dematrixing circuit 21 in which the stereo difference signal (L−R) of the stereo multiplex signal, which is double sideband AM-modulated on the suppressed sub-carrier, is demodulated to the baseband by means of the last-mentioned local mixing carrier, and subsequently this baseband difference signal (L−R) is suitably combined with the baseband sum signal (L+R) of the stereo multiplex signal. In the case of an accurate 0° or 180° phase relation between the local mixing carrier and the suppressed sub-carrier in the stereo multiplex signal, the baseband sum and difference signals (L+R) and (L−R) to be combined are mutually equal and the crosstalk between the decoded left and right stereophonic signals L and R at the audio outputs 6 is minimum. A maximum stereophonic sound reproduction is then obtained.

For the purpose of regenerating the local mixing carrier, the stereo multiplex signal is also applied to a carrier regeneration circuit 12–19 comprising a pilot selection circuit 12 for selection of the 19 kHz stereo pilot signal from the stereo multiplex signal, followed by a phase-locked loop 13–17.

The phase-locked loop 13–17 comprises a phase detector 13 which is coupled to an output of the pilot selection circuit 12 and has, in a loop configuration successively connected to it: a loop filter 14, a voltage-controlled oscillator 15 and first and second cascade-arranged frequency dividers 16 and 17 having dividing factors of 12 and 2, respectively. In the phase-locked state of the loop, the frequency of the oscillator 15 is 2×12×19 kHz=456 kHz, the output frequency of the first frequency divider 16 is 2×19 kHz=38 kHz and the output frequency of the second frequency divider 17 is 19 kHz. The 38 kHz output frequency of the first frequency divider 16 is applied as a local mixing carrier to the synchronous demodulator 20.

The phase of the 19 kHz output frequency of the second frequency divider 17, hereinafter also referred to as oscillator comparison frequency, is compared in the phase detector 13 with that of the stereo pilot signal which is applied as a reference frequency from the pilot selection circuit 12 to the phase detector 13. Phase difference deviating from 90° between the reference frequency and the oscillator comparison frequency produce a d.c. phase control signal which varies the phase of the voltage-controlled oscillator 15 in such a way that these phase differences are reduced.

In order to prevent or at least reduce the influence of unwanted d.c. offset on the d.c. phase control signal, the reference frequency is selectively amplified by means of the pilot selection circuit 12. According to the invention, a bandpass filter of the switched capacitor type is used for this purpose as a pilot selection circuit to which the 456 kHz oscillator signal is applied as a clock signal via a clock input 18. As is known per se, it is possible to realize a very high passband selectively with bandpass filters of the switched capacitor type in a narrow-band region around a frequency determined by the clock frequency, in the given case around 19 kHz. Due to the control from the 456 kHz oscillator signal which is frequency-coupled via the oscillator comparison signal to the stereo pilot signal to be selected, an automatic tuning of the narrow-band passband of the bandpass filter 12 is obtained on the last-mentioned stereo pilot signal. Consequently, a high loop gain is also maintained as frequency variations of this 19 kHz stereo pilot signal and the phase of the oscillator comparison frequency continues to differ accurately by 90° with respect to that of the reference frequency. Starting from a phase transfer of the bandpass filter 12 of 0° at 19 kHz, the 38 kHz oscillator frequency is accurately in phase or in anti-phase with respect to the suppressed sub-carrier in the stereo multiplex signal, which is stated hereinbefore results in a maximum stereo channel separation.

A continuous control of the stereo channel separation from the said maximum value (stereo) to a minimum value (mono) is obtained by continuously controlling the phase transfer of the bandpass filter 12 at 19 kHz by means of a stereo control signal at a control input 19 from 0° to 90°. Then also the 38 kHz oscillator frequency used as a local sub-carrier varies from an in-phase or anti-phase relation with respect to the suppressed sub-carrier to a phase quadrature relation. The amplitude of the baseband stereo difference signal (L−R) then varies from a value 1, that is to say a value which is equal to the amplitude value of the base-band stereo sum signal, to a value 0.

If in the loop d.c. offsets occur which are so large that a non-negligible deviation of the desired phase quadrature relation between the reference frequency and the oscillator comparison frequency is produced, the phase of the reference frequency can be pre-corrected in the bandpass filter 12 in such a way that the phase deviation is compensated by means of this phase pre-correction. Consequently, in spite of phase errors occurring in the loop, it is possible to render the local sub-carrier accurately in phase or in anti-phase with respect to the suppressed sub-carrier and to obtain a high channel separation between the left and right stereo signals. This pre-correction can be realized in a simple manner by suitably setting the stereo control signal.

Figure 2:
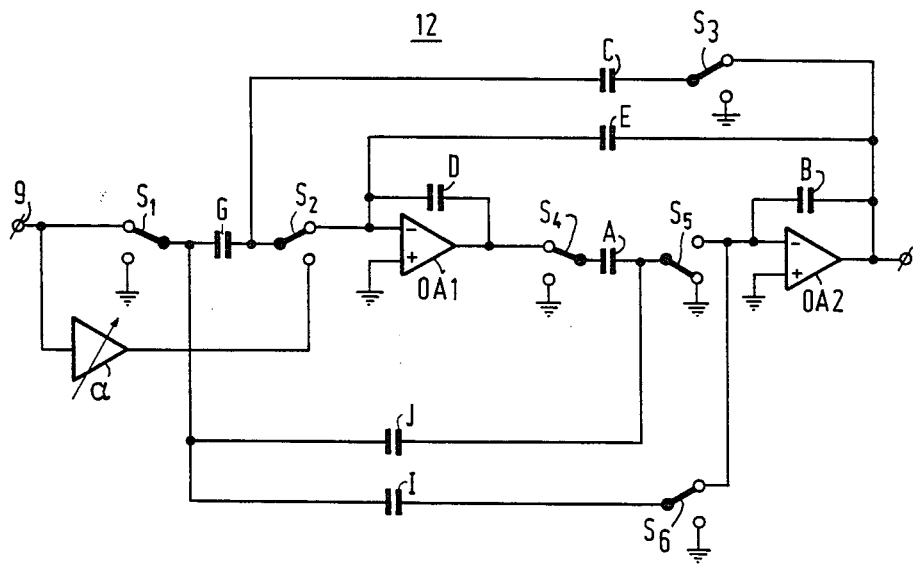
FIG. 2 shows a bandpass filter of the switched capacitor type for use in a stereo decoding arrangement as shown in FIG. 1.

The phase control of the bandpass filter 12 can be realized in known manner by those skilled in the art, for example by means of a variation of a plurality of suitably chosen switched capacitors. Preferably, however, use is made of the bandpass filter 12 as is shown in FIG. 2 whose basic structure is described in the book "Modern Filter Design" by M. S. Ghausi and K. R. Laker, published by Prentice Hall, Inc. in 1981, page 479, FIGS. 6-57(b). The elements of this basic structure have the same reference designations as the corresponding elements in the last-mentioned Figure.

The band-pass filter 12 is shown in one of the two switching phases, for example the even switching phase, and comprises a switched capacitor G with input and output switches $S_1$ and $S_2$ via which it is switched, in the even switching phase, between the multiplex input 9 and an inverting input of an operational amplifier OA1, and in the odd switching phase, it is switched between ground and the output of a controllable amplifier $\alpha$, respectively. The input of the controllable amplifier $\alpha$ is connected to the multiplex input 9. In the odd switching phase, the voltage across the capacitor G is determined by the output voltage of the controllable amplifier $\alpha$ and is equal to $a \cdot V_i$, in which a is the controllable gain factor of the controllable amplifier $\alpha$ and $V_i$ is the input voltage at the multiplex input 9.

The operational amplifier OA1 is connected to ground via a non-inverting input and is fed back via a capacitor D from its output to its non-inverting input. The output of amplifier OA1 is switchably coupled to a switched capacitor A having input and output switches $S_4$ and $S_5$ via which the capacitor A is switched, in the even switching phase, between the output of amplifier OA1 and ground, and, in the odd switching phase, between ground and an inverting input of an operational amplifier OA2, respectively. A non-inverting input of amplifier OA2 is connected to ground and the oiutput of amplifier OA2 is fed back to the inverting input thereof via a capacitor B and is also coupled as an output of the bandpass filter 12 to the phase detector 13 of the phase-locked loop 13–17.

The bandpass filter 12 also comprises capacitors J and I which are switchably connected to the input 9 via the input switch $S_1$ at one end. The capacitor J is switchably connected via the output switch $S_6$ to the inverting input of amplifier OA2 at the other end, and the capacitor I is connected during the even switching phase via an output switch $S_6$ to the inverting input of amplifier OA2, and to ground in the odd switching phase. The common junction point between the capacitor G and its output switch $S_2$ is connected to a capacitor C which is connected via an output switch $S_3$ to the output of the bandpass filter 12 in the even switching phase, and is connected to ground in the odd switching phase, while the inverting input of OA1 is continuously connected to the bandpass filter 12 output via a capacitor E.

The controllable amplifier $\alpha$ (corresponding to a gain factor of zero) does not occur in the basic structure of the bandpass filter described so far and in the odd switching phase the capacitor G is connected to ground via $S_2$. For a description of the operation of this basic structure, reference is made to the abovementioned book, particularly sections 66.2–66.4 on pages 470–481. Those skilled in the art can simply derive a dimensioning of the elements, which renders the bandpass filter suitable for filtering the 19 kHz stereo pilot signal substantially without a phase shift from the stereo multiplex signal under the control of a 456 kHz clock signal.

In practice, a correct operation in an integrated embodiment of the bandpass filter is found to be obtained with the following mutual capacitance ratios:

| A | 8.714 | E | 2.494 |
|---|---|---|---|
| B | 16.762 | G | 4.089 |
| C | 11.989 | I | 7.387 |
| D | 23.857 | J | 2.498 |

With the aid of the controllable amplifier $\alpha$, which is incorporated in the above-described configuration, an extra signal path is introduced in the bandpass filter 12 through which the input signal of the multiplex input 9 is additionally applied in a controllable value to a suitable point (the common junction point between the capacitors G and C) of the filter. A control of this extra input signal supply results in a zero offset in the transfer characteristic of the filter and in a control of the phase transfer of the filter, particularly in the pass-band region around 19 kHz. In the embodiment shown, a phase shift at 19 kHz from 0° to 90° is possible with the controllable amplifier $\alpha$.

Since only the input signal is additionally applied through the extra signal path, a control thereof only influences the zero position and does not influence that of the poles, so that the amplitude transfer of the bandpass filter is not notably influenced by this control.

A realization (not shown) in which also poles are shifted is obtained by arranging a controllable amplifier $\beta$ (not shown) in parallel across the capacitor A in the even switching phase, that is to say by connecting the output of amplifier OA1 to the input of $\beta$ and by connecting the switch $S_5$ in the even switching phase to the output of $\beta$ instead of to ground. The controllable amplifier $\beta$ is now incorporated in a loop and amplifies the output signal $V_{OA1}$ of OA1 by a factor b. The capacitor A is now charged with $(1-b) \cdot V_{OA1}$ instead of with $V_{OA1}$.

This effect corresponds to a capacitance of capacitor A reduced by the factor (1-b) in the basic structure and to a pole shift by approximately the factor (a-b). A controlled phase shift at 19 kHz from 0° to 90° is also possible with such a controlled pole shift, but the amplitude transfer characteristic of the bandpass filter also changes noticeably.

The inventive idea is of course not limited to the use of the bandpass filter shown, but other time-discrete phase-controlled bandpass filters may be used to realize the invention.

While using the inventive idea, it is also feasible to fix the phase transfer of the bandpass filter 12, which is frequency-coupled with the stereo pilot to be selected, at 0° and to realize a controllable stereo-mono transition by means of, for example, an amplitude control of the local sub-carrier or of the demodulated stereo difference signal L−R.

What is claimed is:

1. An arrangement for decoding a stereo multiplex signal, comprising a baseband stereo sum signal (L+R), a stereo difference signal (L−R) which is amplitude-modulated on a suppressed sub-carrier and a pilot signal having a frequency located between the frequency bands of said sum and difference signals, said arrangement having an input for the stereo multiplex signal and left and right stereo signal outputs, said input being coupled both via a pilot selection circuit to a phase-locked loop for regenerating the sub-carrier and to a multiplier circuit for multiplying at least the modulated stereo difference signal (L−R) by the regenerated sub-carrier, characterized in that the pilot selection circuit comprises a bandpass filter of the switched capacitor type, a clock input of which is coupled to an output of a voltage-controlled oscillator incorporated in the phase-locked loop, wherein a phase transfer of said bandpass filter varies at least at the pilot signal frequency in dependence upon a mono-stereo control signal.

2. An arrangement as claimed in claim 1, characterized in that a signal path of the bandpass filter, in one of two switching phases, incorporates a controllable amplifier which is coupled to at least one switched capacitor for applying a controllable signal voltage thereto, the voltage gain of the controllable amplifier varying in dependence upon the mono-stereo control signal to provide said phase transfer of said bandpass filter.

3. An arrangement as claimed in claim 2, characterized in that the controllable amplifier in said one switching phase amplifies the input signal of the bandpass filter in a substantially controllable manner.

4. An arrangement as claimed in claim 1, characterized in that the bandpass filter has a phase characteristic which is substantially zero at the location of the pilot signal frequency at a value of the mono-stereo control signal at which there is maximum stereo channel separation.

* * * * *